(12) United States Patent
Morimoto et al.

(10) Patent No.: US 6,706,155 B2
(45) Date of Patent: Mar. 16, 2004

(54) SPUTTERING APPARATUS AND FILM MANUFACTURING METHOD

(75) Inventors: Naoki Morimoto, Susono (JP); Tomoyasu Kondo, Gotenba (JP); Hideto Nagashima, Gotenba (JP)

(73) Assignee: Qlvac, Inc., Chigasaki (JP)

( * ) Notice: Subject to any disclaimer, the term of this patent is extended or adjusted under 35 U.S.C. 154(b) by 82 days.

(21) Appl. No.: 09/939,715

(22) Filed: Aug. 28, 2001

(65) Prior Publication Data

US 2002/0029960 A1 Mar. 14, 2002

(30) Foreign Application Priority Data

Sep. 7, 2000 (JP) .......................................... 2000-270880

(51) Int. Cl.[7] .............................................. C23C 14/34
(52) U.S. Cl. ........................... 204/192.12; 204/298.06; 204/298.11; 204/298.14
(58) Field of Search ...................... 204/298.06, 298.11, 204/298.14, 192.12

(56) References Cited

U.S. PATENT DOCUMENTS 5,316,645 A * 5/1994 Yamagami et al. .... 204/298.06
6,296,743 B1 * 10/2001 Talieh ................... 204/192.22
6,398,929 B1 * 6/2002 Chiang et al. ......... 204/298.11
6,413,392 B1 * 7/2002 Sahoda et al. ......... 204/298.18

* cited by examiner

Primary Examiner—Rodney G. McDonald
(74) Attorney, Agent, or Firm—Armstrong, Kratz, Quintos, Hanson & Brooks, LLP.

(57) ABSTRACT

In order to form a thin film having a high aspect ratio, a space between a target within a vacuum chamber and a substrate table is enclosed by an anode electrode and earth electrodes. The anode electrode is positioned on the side of the target, and a positive voltage is applied. The earth electrodes are positioned on the side of the substrate table and are connected to earth potential. A trajectory of sputtering particles curved in the direction of flying off by the anode electrode is corrected and is made incident in a perpendicular manner to a surface of the substrate on the substrate table. The amount of sputtering particles incident to the surface of the substrate can therefore be increased and made perpendicularly incident; and a thin film of a high aspect ratio can be formed.

13 Claims, 4 Drawing Sheets

SPUTTERING APPARATUS AND FILM MANUFACTURING METHOD

BACKGROUND OF THE INVENTION

1. Field of The Invention

The present invention relates to the technological field of sputtering apparatus, and particularly to improvement of step coverage of sputtering apparatus.

2. Description of Related Art

A related sputtering apparatus is shown by numeral 110 in FIG. 6.

This sputtering apparatus 110 has a vacuum chamber 112, with a wafer stage 114 fitted onto a bottom wall of the vacuum chamber 112 in such a manner as to be insulated from the wall surface of the vacuum chamber 112.

A ceiling plate 113 is fitted to the ceiling side (of the vacuum chamber 112 via an insulating member 118. A magnet 119 is located on the ceiling plate 113 via an insulating member (not shown) and a target 120 is located at an inside surface of the vacuum chamber 112 at the surface on the opposite side to the magnet 119.

A cooling equipment 115 and a substrate table 116 are mounted, in order, on the wafer stage 114. A chucking electrode (not shown) is located inside the substrate table 116. The inside of the vacuum chamber 112 is evacuated and a substrate 117 is mounted on the substrate table 116. When a voltage is then applied to the chucking electrode, the substrate 117 is electrostatically chucked to the surface of the substrate table 116.

A sputtering power supply 125 is connected to the target 120 and the vacuum chamber 112 is connected to earth potential. After the inside of the vacuum chamber 112 is evacuated and the substrate 117 is electrostatically chucked onto the substrate table 116, a sputtering gas is introduced into the vacuum chamber 112 and the sputtering power supply 125 is activated. When a negative voltage is then applied to the target 120, a plasma is generated in the vicinity of the surface of the target 120 as a result of electrons being captured by magnetic lines of force of the magnet 119. When this plasma is incident to the target 120, the material making up the target 120 flies off from the surface of the target 120 as sputtering particles.

At the sputtering apparatus 110, a cylindrical deposition preventing plate 111 is located within the vacuum chamber 112 and is fixed to the surface of the inner wall of the vacuum chamber 112. The deposition preventing plate 111 is also positioned at earth potential together with the vacuum chamber 112 because the vacuum chamber 112 is located at earth potential.

A negative voltage is applied to the wafer stage 114, and the substrate 117 is positioned at negative potential. Electrons in the plasma are chucked towards the deposition preventing plate 111, and sputtering particles having a positive potential flying off from the target 120 are chucked towards the substrate 117. As a result, sputtering particles fly off in a direction along a central axis of the deposition preventing plate 111 within the deposition preventing plate 111; and a thin film is formed at the surface of the substrate 117 upon the sputtering particles reaching the surface of the substrate 117.

A water path 123 is provided within the cooling equipment 115. After a thin film is formed to a predetermined thickness at the surface of the substrate 117, cooling water flows in the water path 123. After the substrate 117 is cooled, the substrate 117 is carried outside of the vacuum chamber 112. When an as-yet unprocessed substrate is introduced into the vacuum chamber 112, the thin film forming operation can then be repeated.

The sputtering particles do not become attached to the surface of the inner wall of the vacuum chamber 112 because the deposition preventing plate 111 is located at the periphery of the flight path of the sputtering particles. Therefore, when a multiplicity of substrates 117 are processed and the inside of the vacuum chamber is cleaned, the deposition preventing plate 111 is extracted; and thin film that has become attached to the inner peripheral surface of the deposition preventing plate 111 is cleaned and removed.

Therefore, with the deposition preventing plate 111 of the above configuration, the prevention of thin film becoming attached to the surface of the inner wall of the vacuum chamber 112 is halted when the deposition preventing plate 111 is extracted, and this cannot be said to improve the performance of the sputtering apparatus 110.

In recent years, attempts have been made to improve the step coverage of thin films formed at the surface of the substrate 117 by applying a voltage to the deposition preventing plate 111, but sufficient step coverage has yet to be obtained As the present invention sets out to resolve the aforementioned problems of the related art, it is the object of the present invention to provide a sputtering apparatus capable of forming a thin film with a good step coverage.

SUMMARY OF THE INVENTION

In order to resolve the aforementioned problems, a sputtering apparatus comprises a vacuum chamber, a target positioned within the vacuum chamber, a substrate table located within the vacuum chamber at a position facing the target, an anode electrode surrounding the periphery of a portion, on the target side, of flying space where sputtering particles flying off from the target are flying, of space between the target and the substrate table, and an earth electrode encompassing a portion, of the remaining portion of the flying space, between the anode electrode and the substrate table. The earth electrode and the anode electrode are electrically insulated from each other and are subjected to the application of different voltages.

The sputtering apparatus of the present invention has a power supply, wherein the vacuum chamber and the earth electrodes are connected to earth, and the power supply applies a positive voltage to the anode electrode.

With this sputtering apparatus, a substrate table is mounted on a wafer stage; and a negative voltage can be applied to the wafer stage.

Further, with this sputtering apparatus, the earth electrode can be divided into first and second earth electrodes, with a gap being formed between the first and second earth electrodes.

Moreover, with the sputtering apparatus of the present invention having the target located at the top and the substrate table located below the target, the anode electrode can be formed a tubular shape, and a flange can be provided at the outer periphery of one end of the anode electrode, with a conductive terminal member insulated electrically from the vacuum chamber projecting at the inside of the vacuum chamber, and at the anode electrode, the flange mounting the terminal member, and the opening on the opposite side to the opening provided with the flange facing the substrate table.

Still further, in a thin film manufacturing method of the present invention where a target is positioned in a vacuum chamber, the vacuum chamber is connected to earth potential, a negative voltage is applied to the target so that a plasma is formed in the vicinity of the surface of the target, and sputtering particles flying off from the target reach a substrate positioned with a surface facing the target so as to form a thin film on the surface of the substrate, with an anode electrode surrounding the periphery of a portion, on the target side, of flying space where sputtering particles flying off from the target are flying, of space between the target and the substrate table, comprising a step of connecting the potential of the periphery surrounding the substrate to earth potential, applying a positive voltage to the anode electrode, and sputtering the target.

In the present invention, a negative bias voltage is applied to the substrate.

When the present invention is configured in the above manner, when the space between the target and the substrate is taken to be the flying space of the sputtering particles, the potential of the vacuum chamber is connected to earth potential; and a positive voltage can be applied to the anode electrode encompassing the portion of this flying space which is on the target side. The same earth potential, as applied to the vacuum chamber can then also be applied to the earth electrode encompassing the substrate-side portion of the flying space.

When a large negative voltage is applied to the target and a smaller negative voltage compared to that applied to the target is applied to the substrate, in experiments, the sputtering particles are made to converge onto the substrate and a large number of sputtering particles therefore become incident to the substrate.

This is particularly useful because just a few sputtering particles can also be made to converge onto the substrate when only a few sputtering particles fly off from the target or when only a few sputtering particles fly in the direction of the substrate.

For example, if the target is copper and sputtering gas is introduced just when sputtering commences, after sputtering starts once, when the sputtered copper is again made incident to the target so that the copper is sputtered, self-discharging of the copper itself can be utilized to maintain a plasma. However, the sputtering particles of copper flying on the substrate side are few with sputtering employing the self-discharging of copper; thereby, making the present invention particularly effective.

Further, it is necessary to insulate the anode electrode from the vacuum chamber when a positive voltage is applied to the anode electrode. However, with the sputtering apparatus of the present invention, a terminal member insulated from the vacuum chamber projects at the inner surface of the vacuum chamber, and a flange of the anode electrode is positioned above this terminal member. The anode member therefore does not make contact with the vacuum chamber and can be extracted from the vacuum chamber just as a result of being lifted up, which result in effective and easy maintenance. The above-described objects and other objects, features, and benefits or advantages of the present invention will become more apparent from the following detailed description of embodiments of this invention in conjunction with the accompanying drawings.

DETAILED DESCRIPTION OF THE PREFERRED EMBODIMENT

Figure 1:
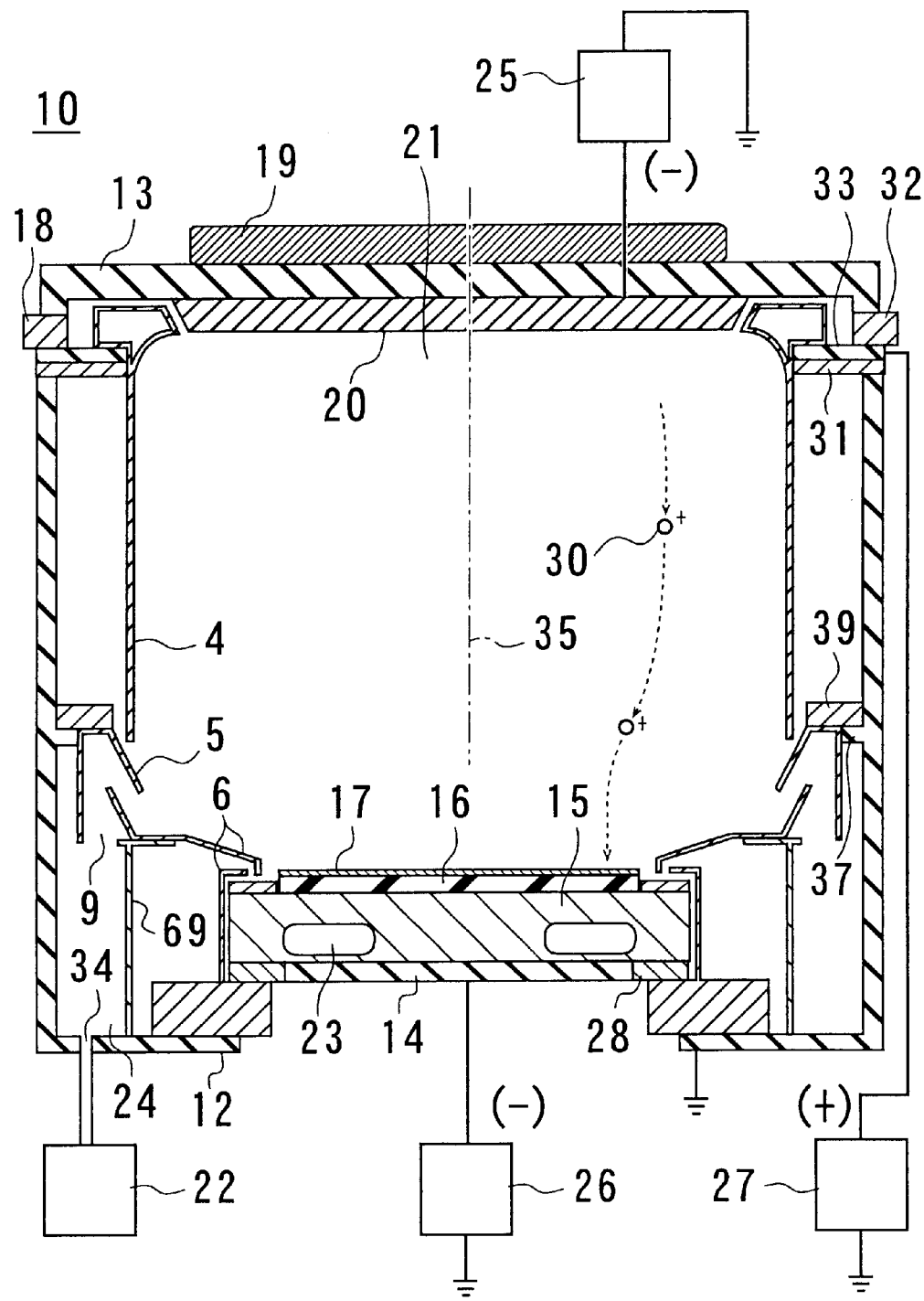
FIG. 1 is an embodiment of a sputtering apparatus of the present invention.

Referring to FIG. 1, an embodiment of a sputtering apparatus 10 of the present invention has a vacuum chamber 12. A wafer stage 14 is located so as to be insulated electrically from the vacuum chamber 12 at the bottom surface of the vacuum chamber 12.

The upper end of the vacuum chamber 12 is open. A ring-shaped first insulating member 31, conductive terminal member 33 and second insulating member 32 are then positioned sequentially at the upper end of the vacuum chamber 12.

A ceiling plate 13 is located on the second insulating member 32. The vacuum chamber 12 is covered by the ceiling plate 13, and the inside of the vacuum chamber 12 is isolated from the atmosphere.

In this state, the vacuum chamber 12, the terminal member 33 and the ceiling plate 13 are electrically insulated from each other by the first and second insulating members 31 and 32.

A magnet 19 is located at the upper part of the ceiling plate 13, with a target 20 being located at the surface of the inner side of the vacuum chamber 12 on the surface on the opposite side to which the magnet 19 is located. The magnetic lines of force generated by this magnet 19 pass through the surface of the target 20.

Figure 2:
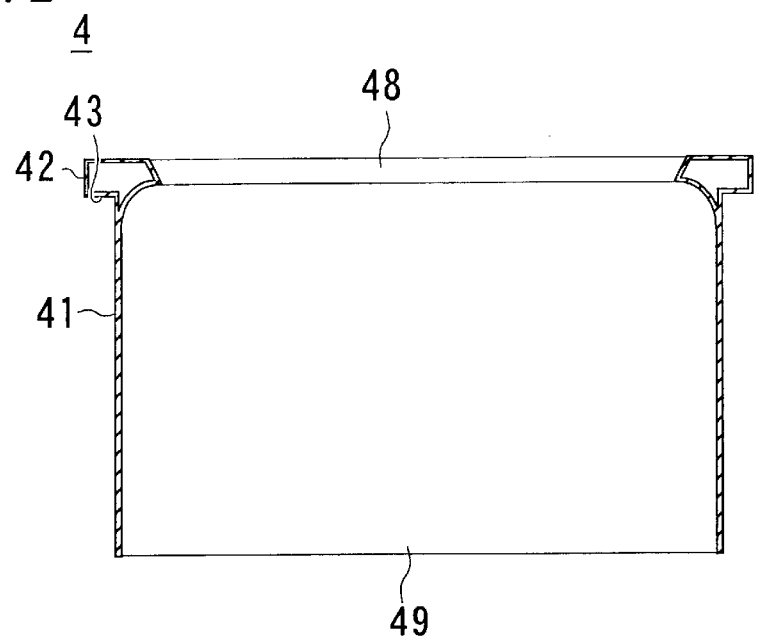
FIG. 2 is a view illustrating an anode electrode.

An anode electrode 4 shown in FIG. 2 is located within the vacuum chamber 12. The anode electrode 4 comprises a cylindrical-shaped deposition preventing tube 41, and a flange 42 positioned at the open end of the deposition preventing tube 41 and projecting from the outer periphery of the deposition preventing tube 41 as far as an outside position. Of the two openings 48 and 49 of the deposition preventing tube 41, numeral 48 shows an opening for where the flange 42 is positioned and numeral 49 shows an opening on the opposite side.

The outer diameter of the deposition preventing tube 41 is the same or slightly smaller than the internal diameter of the ring-shaped terminal member 33 so that the ceiling plate 13 can be opened, the flange 42 side of the deposition preventing tube 41 can be made to face upwards, and the opening 49 on the opposite side can be inserted to within the terminal member 33. When the deposition preventing tube 41 is inserted into the terminal member 33, the bottom surface 43 of the flange 42 becomes mounted on the terminal member 33.

The wall surface of the vacuum chamber 12 is vertical; and the surface of the terminal member 33 is horizontal. The deposition preventing tube 41 is therefore made to hang vertically from the terminal member 33 with the flange 42 mounted on the terminal member 33. The anode electrode 4 is then electrically connected to the terminal member 33 in this state.

After the anode electrode 4 is mounted at the inner side of the terminal member 33, when the ceiling plate 13 is returned to its original position, the target 20 is located on the inside at the upper end of the terminal member 33 so as not to make contact with the anode electrode 4.

A sputtering power supply 25, a bias power supply 26 and a control power supply 27 are located at the outer part of the vacuum chamber 12.

The control power supply 27 is connected to the terminal member 33 so that the voltage outputted by the control power supply 27 is applied to the anode electrode 4 via the terminal member 33.

Further, the sputtering supply 25 is connected to the target 20; and the bias power supply 26 is connected to the wafer stage 14. The desired voltage can then be applied to the target 20 and the wafer stage 14 by the sputtering supply 25 and the bias power supply 26.

Further, first and second earth electrodes 5 and 6 are located at positions below the anode electrode 4 in this state.

Figure 3:
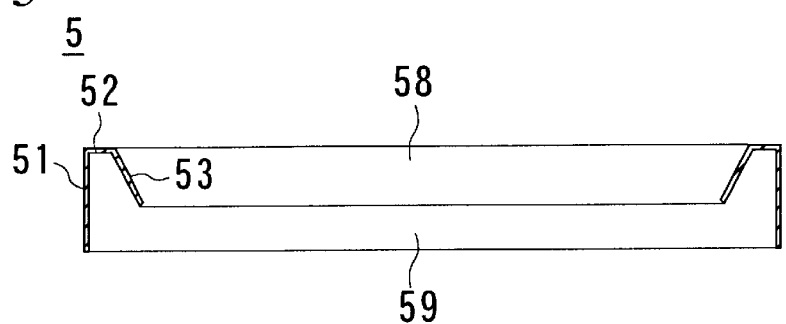
FIG. 3 is a view illustrating a first earth electrode.

As shown in FIG. 3, the first earth electrode 5 comprises a cylindrical outer tube 51, a ring-shaped connector 52 of an outer diameter of the same diameter as the outer tube 51 and of an inner diameter smaller than the diameter of the outer tube 51, and a cylindrical inner tube 53 with one opening of the same diameter as the inner diameter of the connector 52 and another opening of a smaller diameter than the inner diameter of the connector 52.

The outer peripheral portion of the connector 52 is connected to an open portion of the outer tube 51; and the inner tube 53 is positioned within the outer tube 51, with the large diameter open end being connected to the edge portion of the inner diameter of the connector 52.

The first earth electrode 5 comprises an opening 59 that is an opening of the outer tube 51, and an opening 58 that is the large diameter opening of the inner tube 53 and is positioned on the opposite side to the opening 59.

A connecting member 39 is fitted at a position in the vicinity of the lower end of the anode electrode 4 of the wall surface of the vacuum chamber 12. In the first earth electrode 5, the surface of the connector 52 is fixed to the connecting member 39 and the opening 59 of the outer tube 51 faces downwards. A projection 37 is provided at the wall surface of the vacuum chamber 12. When the surface of the connector 52 is fixed to the connecting member 39, the upper end of the outer periphery of the outer tube 51 makes contact with the projection 37 so that the first earth electrode 5, in its entirety, makes electrical contact with the vacuum chamber 12.

Further, in this state, the lower end of the anode electrode 4 is positioned in such a manner as to not make contact with the inside of the inner tube 53 of the first earth electrode 5.

Figure 4:
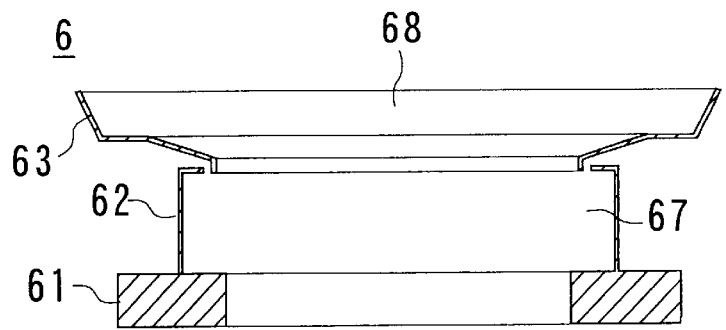
FIG. 4 is a view illustrating a second earth electrode.

The second earth electrode 6 is arranged, as shown in FIG. 4, at a position below the first earth electrode 5. The second earth electrode 6 comprises a pedestal 61, tube 62 and bowl section 63.

The pedestal 61 is ring-shaped and the tube 62 is cylindrical. An opening at a lower end of the tube 62 is connected to an upper end of the pedestal 61. The bowl-section 63 is cylindrical in shape with a broadening upper end opening and has a lower end opening that is substantially the same size as the diameter of the tube 62 and is located in the vicinity of the opening at the upper end of the tube 62. The bowl section 63 is not fixed to the tube 62 and can therefore be detached during cleaning and is held above the bottom of the vacuum chamber 12 by two support rods 69 located below the bowl section 63.

The pedestal 61 is located on the bottom wall of the vacuum chamber 12 with an opening 68 at an upper end of the bowl section 63 facing towards the side of the target 20 above.

The pedestal 61, tube 62, bowl section 63 and support rods 69 are constructed of conductive material and the pedestal 61 and the support rods 69 come into contact with the vacuum chamber 12 so as to make electrical contact. The tube 62 and the bowl section 63, i.e. the entire second earth electrode 6, are therefore at the same potential as the vacuum chamber 12. As described above, the first earth electrode 5 is made to be the same potential as the vacuum chamber 12; and the vacuum chamber 12 is connected to earth. This means that the first and second earth electrodes 5 and 6 are also placed at earth potential.

The pedestal 61 of the second earth electrode 6 has a portion hanging over further towards the inside than the tube 62, and an insulating member 28 is located on the surface of this member.

The cooling equipment 15 and the substrate table 16 are mounted, in order, on the insulating member 28. The cooling equipment 15 and the substrate table 16 are therefore arranged at an inner part 67 of the tube 62; and the periphery of the cooling equipment 15 and the substrate table 16 are encompassed by the tube 62. The surface of the substrate table 16 is positioned in the vicinity of the opening 68. The surface of the substrate table 16 is therefore exposed within the vacuum chamber 12 and is positioned so as to face the target 20 and be parallel to the target 20.

Numeral 21 indicates a flying space where, as is described later, sputtering particles fly off from the target 20 towards the direction of the substrate table 16.

The anode electrode 4, the first earth electrode 5 and the second earth electrode 6 are arranged in such a manner as to substantially coincide with a central axial line. Further, the upper end of the bowl-section 63, i.e. the upper end of the second earth electrode 6, is inserted between the outer tube 51 of the first earth electrode 5 and the inner tube 53 in such a manner as to not make contact. The flying space 21 between the substrate table 16 and the target 20 is therefore enclosed by the anode electrode 4 and the first and second earth electrodes 5 and 6.

The diameter of the target 20 used here is 300 mm. The distance from the target surface to the lower end of the anode electrode 4 is approximately 220 mm; and the distance from the surface of the target 20 to the surface of the substrate table 16 is 300 mm. The upper end of the anode electrode 4 curves towards the side of the target 20. The diameter of this portion is substantially the same as the diameter of the target 20, but the diameter of the portion arranged vertically is approximately 330 mm and is therefore larger than the diameter of the target 20.

There is no contact between the lower end of the first earth electrode 5 and the upper end of the second earth electrode 6, with a gap 9 existing therebetween. The flying space 21 is connected to an external space 24 on the outside of the anode electrode 4 and the first and second earth electrodes 5 and 6 by the gap 9.

An exhaust opening 34 is formed at the bottom wall of the vacuum chamber 12; and a vacuum pump 22 is connected to this exhaust opening 34. When the vacuum pump 22 is started up and the external space within the vacuum chamber 12 is evacuated from the exhaust opening 34, the flying space 21 within the anode electrode 4 is evacuated from the gap 9 between the first earth electrode 5 and the second earth electrode 6.

The process for forming a thin film on the substrate surface using the sputtering apparatus 10 will now be described. After the inside of the vacuum chamber 12 is evacuated as described above, and the inside of the vacuum chamber 12 is put at a predetermined pressure, the substrate is transported to inside the vacuum chamber 12 and mounted on the substrate table 16.

Numeral 17 of FIG. 1 shows the substrate in this state. The surface on the outer side of the substrate 17 faces the lower end portion of the second earth electrode 6 without making contact.

The substrate table 16 is an electrostatic chuck, with a chucking electrode (not shown) and a heater being located within the substrate table 16. After the substrate 17 is mounted on the substrate table 16, when a voltage is applied to the chucking electrode, the substrate 17 is electrostatically chucked to the surface of the substrate table 16. During this time, the heater within the substrate table 16 is energized so as to generate heat and the substrate 17 is heated.

With the substrate 17 heated to a predetermined temperature, when sputtering gas such as argon gas or the like is introduced to within the vacuum chamber 12, the sputtering power supply 25 and bias power supply 26 are activated and a negative voltage is applied to the target 20 and the wafer stage 14; then, a sputtering gas plasma is generated in the vicinity of the surface of the target 20 and the surface of the target 20 is sputtered.

This target 20 is made of copper, and copper particles fly off from the surface of the target 20 constituting sputtering particles. A magnetic field is formed by magnetic lines of force of the magnet 19 in the vicinity of the surface of the target 20. The electrons are then confined by this magnetic field; and a plasma of electrons and sputtering particles is formed in the vicinity of the surface of the target 20.

In this state, when the introduction of the sputtering gas is halted, the target 20 is sputtered by sputtering particles within the plasma (self-discharge phenomena).

When sputtering commences, the control power supply 27 is activated, a positive voltage is applied to the anode electrode 4 and the sputtering particles have a positive charge. Sputtering particles, of the sputtering particles flying off from the target 20, flying in the direction of the substrate 17 and the direction of the anode electrode 4, are therefore subjected to electrostatic force from the anode electrode 4 and have a curved trajectory in the direction of the central axial line 35 of the anode electrode 4. Numeral 30 indicates these sputtering particles.

The first and second earth electrodes 5 and 6 are connected to earth potential; and a negative voltage is applied to the wafer stage 14. The potential of the anode electrode 4 is the highest, followed by the potential of the portion at which the first and second earth electrodes 5 and 6 are located, with the potential in the direction of the position of the substrate 17 being the lowest.

Sputtering particles flying out from the opening 49 at the lower end of the anode electrode 4, after being bent once in a trajectory in the direction of the central axial line 35 of the anode electrode 4, are adjusted to a trajectory in the direction of the substrate 17. As a result, a large amount of sputtering particles become perpendicularly incident to the surface of the substrate 17.

In the related art, the member corresponding to the second earth electrode 6 is not connected to earth but is instead put at a floating potential. A large amount of sputtering particles are therefore incident to the surface of the substrate 17 with the sputtering apparatus 10 of the present invention compared with the related art where few sputtering particles are incident to the substrate. An overhang formed at the opening of a micropore is therefore struck by perpendicularly incident sputtering particles and moves to the side of the bottom surface of the micropore. As a result, step coverage for thin films formed using the sputtering apparatus 10 of the present invention is improved.

Figure 5:
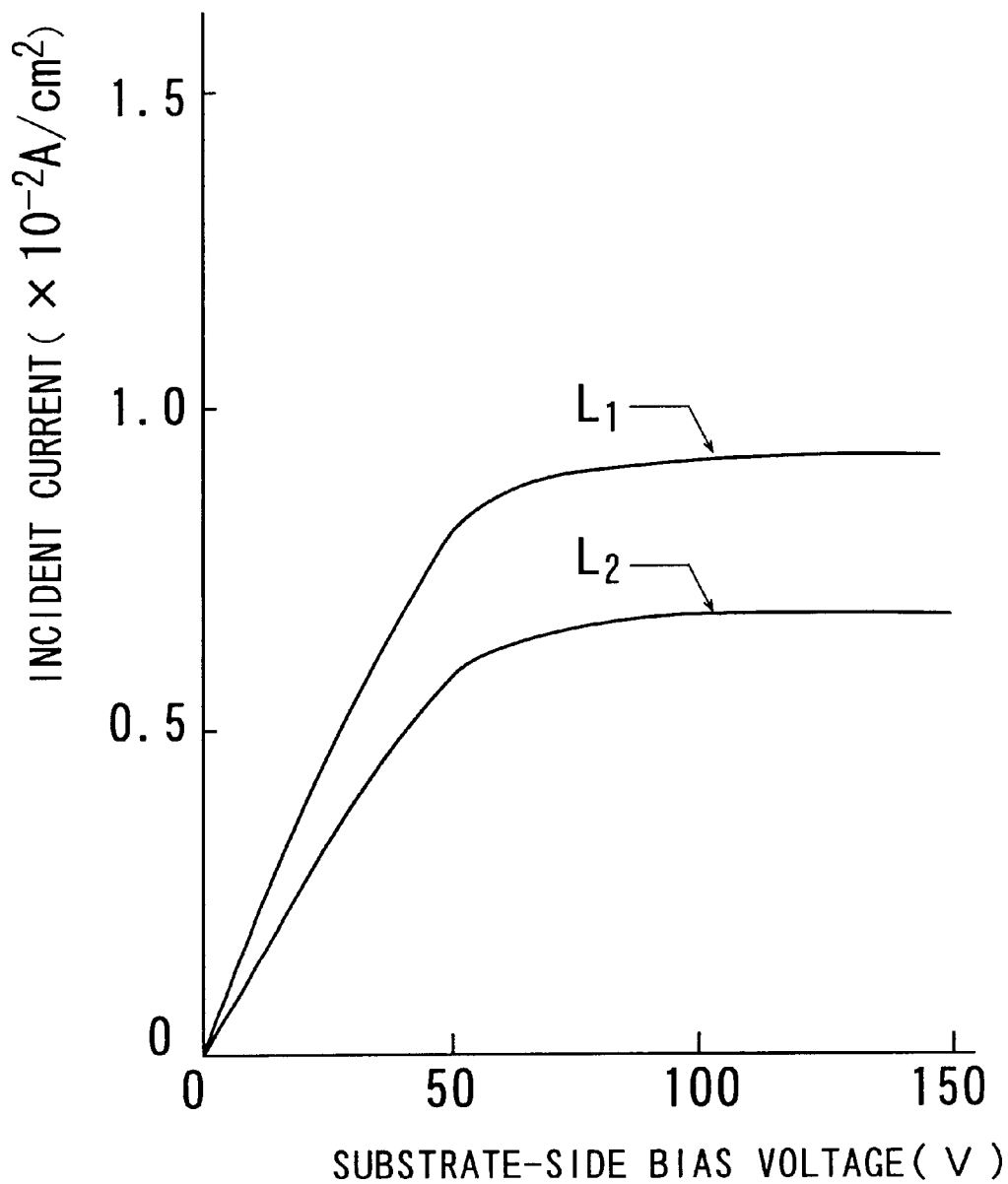
FIG. 5 is a graph illustrating incident current to the substrate of the sputtering apparatus of the present invention.
Figure 6:
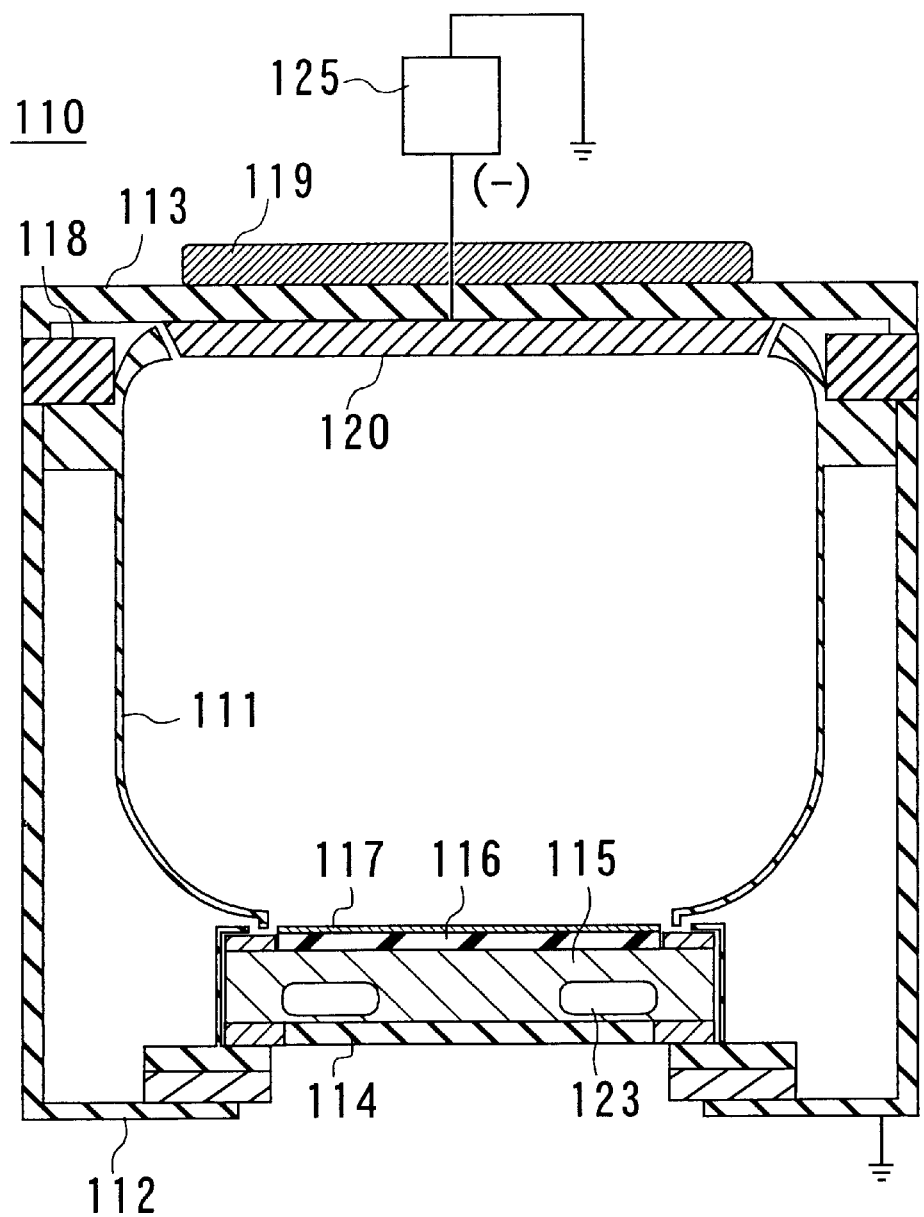
FIG. 6 is an example of a sputtering apparatus of the prior art.

The graph of FIG. 5 shows the relationship between the bias voltage applied to the substrate 17 (i.e., the magnitude of the bias voltage applied to the wafer stage 14), and the magnitude of the incident current flowing at the substrate 17 (i.e., the amount of sputtering particles incident to the substrate 17). Sputtering is performed with a sputtering voltage of −550V being applied to the target 20.

The curve shown by $L_1$ shows the case for the sputtering apparatus 10 of the present invention, and the curve shown by $L_2$ shows the case for a sputtering apparatus of the same structure as the sputtering apparatus 10 of the present invention but with the first and second earth electrodes 5 and 6 of the sputtering apparatus being at a floating potential.

It can be understood that the amount of sputtering particles incident to the substrate 17 is greater for the sputtering apparatus 10 of the present invention.

Compared with the related sputtering apparatus where the member corresponding to the second earth electrode 6 is put at a floating potential, with the sputtering apparatus 10 of the present invention, the sputtering particles have their trajectory adjusted by the second earth electrode 6 so as to be perpendicularly incident to the surface of the substrate 17. The amount of sputtering particles that directly reach the bottom surface of the micropore is therefore substantial; and step coverage is therefore substantially improved.

While a bias voltage is being applied to the substrate 17, the side surfaces of the cooling equipment 15 and the substrate table 16 are surrounded by the second earth electrode 6. There is therefore no abnormal discharge between the cooling equipment 15 and the substrate table 16, and the vacuum chamber 12.

After the target 20 is sputtered and the thin film (in this case, a copper thin film) of a predetermined thickness is formed on the surface of the substrate 17, the sputtering power supply 25, bias power supply 26 and control power supply 27 are halted, the sputtering is ended, and energizing of the heater within the substrate table 16 is ended. In addition, cooling water flows in the water pipe 23 within the cooling equipment 19 and the substrate 17 is cooled.

When the temperature of the substrate 17 falls to a predetermined temperature, the substrate is conveyed outside of the vacuum chamber 12, an as-yet unprocessed substrate is brought in, and sputtering is performed using the same process as described above.

After a copper thin film is formed on a multiplicity of substrates, when the inside of the vacuum chamber 12 is cleaned, the ceiling plate 13 is removed, the anode electrode 4 and the first and second earth electrodes 5 and 6 are removed, and the vacuum chamber 12 and the removed members are washed. The anode electrode 4 can easily be removed simply by lifting upwards so that washing and other maintenance operations of vacuum chamber and the removed members can be readily accomplished.

As described above, according to the sputtering apparatus 10 of the present invention, the sputtering particles 30 flying off from the target 20 are first curved by the anode electrode 4 to the direction of central axis of the anode electrode, and then curved in the opposite direction by the first and second earth electrodes 5 and 6. It is therefore easy for sputtering particles to be perpendicularly incident to the surface of the substrate 17 and the micropore can be filled at a high aspect ratio.

In the above, a description is given of the case where sputtering is carried out utilizing a self-discharging phenomena of copper. However, generally, sputtering particles have positive charge. The present invention is therefore effective for all sputtering methods for sputtering a target using sputtering gas or reactive gas.

The anode electrode 4 and first and second earth electrodes 5 and 6 are circular in cross-section (cylindrical) in the above, but may also be a rectangle or other polygon. Further, it goes without saying that the above also includes combinations of cylinders and angular cross section tubes.

The trajectory of the sputtering particles can be adjusted so that the sputtering particles are incident perpendicular to the substrate surface because the earth electrode is located between the anode electrode and the substrate table.

What is claimed is:

1. A sputtering apparatus comprising:

a vacuum chamber a target positioned within the vacuum chamber;

a substrate table located within the vacuum chamber at a position facing the target;

an anode electrode surrounding the periphery of a portion, on the target side, of flying space where sputtering particles flying off from the target are flying, of space between the target and the substrate table, the anode electrode having, at an outer periphery of one end thereof, a flange;

an earth electrode encompassing a portion, of the remaining portion of the flying space, between the anode electrode and the substrate table; and a conductive terminal, electrically insulated from the vacuum chamber, projects towards an inside portion of the vacuum chamber, the flange of the anode electrode being mounted on the conductive terminal, wherein the earth electrode and the anode electrode are electrically insulated from each other and are subjected to the application of different voltages; and the vacuum chamber and the earth electrode are connected to earth potential, and a positive voltage is applied to the anode electrode.

2. The sputtering apparatus according to claim 1, wherein the substrate table is mounted on a wafer stage, and wherein a negative voltage can be applied to the wafer stage.

3. The sputtering apparatus according to claim 1, wherein the earth electrode is divided into first and second earth electrodes, with a gap being formed between the first and second earth electrode.

4. The sputtering apparatus according to claim 1, wherein the target is located at the top and the substrate table is located below the target, wherein the anode electrode is formed in a tubular shape, and the opening on the opposite side to the opening provided with the flange faces the substrate table.

5. A film manufacturing method wherein a target is positioned in a vacuum chamber, the vacuum chamber is connected to earth potential, a negative voltage is applied to the target so that a plasma is formed in the vicinity of the surface of the target, and sputtering particles flying off from the target reach a substrate positioned with a surface facing the target so as to form a film on the surface of the substrate, the film forming method, comprising the steps of surrounding with an anode electrode, the periphery of a portion on the target side, of flying space where sputtering particles flying off from the target are flying, of space between the target and the substrate table, the anode electrode having, at an outer periphery of one end thereof, a flange;

surrounding the periphery of the portion of flying space of the substrate with an earth electrode;

applying a positive voltage to the anode electrode through a conductive terminal which is electrically insulated from the vacuum chamber, the conductive terminal projecting towards an inside portion of the vacuum chamber, and the flange of the anode electrode being mounted on the conductive terminal;

connecting the earth electrode to earth potential;

sputtering the target; and curving a flying direction of the sputtering particles to the direction of central axis of the anode electrode by the anode electrode, then curving the flying direction in the opposite direction by the earth electrode so t at sputtering particles are incident to the substrate.

6. The film manufacturing method according to claim 5, further comprising the step of applying a negative bias voltage to the substrate.

7. A sputtering apparatus comprising:

a vacuum chamber a target positioned within the vacuum chamber;

a substrate table located within the vacuum chamber at a position facing the target;

an anode electrode surrounding the periphery of a portion, on the target side, of flying space where sputtering particles flying off from the target are flying, of space between the target and the substrate table, the anode electrode having, at an outer periphery of one end thereof, a flange;

an earth electrode encompassing a portion, of the remaining portion of the flying space, between the anode electrode and the substrate table and a conductive terminal, electrically insulated from the vacuum chamber, projects towards an inside portion of the vacuum chamber, the flange of the anode electrode being mounted on the conductive terminal, wherein the earth electrode and the anode electrode are electrically insulated from each other and are subjected to the application of different voltages, an upper portion of the anode electrode is curved in a direction where the target is located, and the earth electrode extends towards the axis of the anode electrode at an angle relative to the anode electrode.

8. A sputtering apparatus comprising:

a vacuum chamber a target positioned within the vacuum chamber;

a substrate table located within the vacuum chamber at a position facing the target;

an anode electrode surrounding the periphery of a portion, on the target side, of flying space where sputtering particles flying off from the target are flying, of space between the target and the substrate table the anode electrode having, at an outer periphery of one end thereof, a flange;

an earth electrode encompassing a portion, of the remaining portion of the flying space, between the anode electrode and the substrate table; and a conductive terminal, electrically insulated from the vacuum chamber, projects towards an inside portion of the vacuum chamber, the flange of the anode electrode being mounted on the conductive terminal, wherein the earth electrode and the anode electrode are electrically insulated from each other and are subjected to the application of different voltages, a lower portion of the earth electrode is curved in a direction where the substrate table is located, and the earth electrode extends towards the axis of the anode electrode at an angle relative to the anode electrode.

9. A sputtering apparatus comprising:

a vacuum chamber a target positioned within the vacuum chamber;

a substrate table located within the vacuum chamber at a position facing the target;

an anode electrode surrounding the periphery of a portion, on the target side, of flying space where sputtering particles flying off from the target are flying, of space between the target and the substrate table the anode electrode having, at an outer periphery of one end thereof, a flange;

an earth electrode encompassing a portion, of the remaining portion of the flying space, between the anode electrode and the substrate table; and a conductive terminal, electrically insulated from the vacuum chamber, projects towards an inside portion of the vacuum chamber, the flange of the anode electrode being mounted on the conductive terminal, wherein the earth electrode and the anode electrode are electrically insulated from each other and are subjected to the application of different voltages, a length between a upper end and a lower end of the anode electrode is longer than a length between an upper end and lower end of the earth electrode, and the earth electrode extends towards the axis of the anode electrode at an angle relative to the anode electrode.

10. A sputtering apparatus comprising:

a vacuum chamber;

a target positioned within the vacuum chamber;

a substrate table located within the vacuum chamber at a position facing the target;

an anode electrode surrounding the periphery of a portion, on the target side, of flying space where sputtering particles flying off from the target are flying, of space between the target and the substrate table the anode electrode having, at an outer periphery of one end thereof, a flange;

an earth electrode encompassing a portion, of the remaining portion of the flying space, between the anode electrode and the substrate table; and a conductive terminal, electrically insulated from the vacuum chamber, projects towards an inside portion of the vacuum chamber, the flange of the anode electrode being mounted on the conductive terminal, wherein the earth electrode and the anode electrode are electrically insulated from each other and are subjected to the application of different voltages;

the vacuum chamber and the earth electrode are connected to earth potential and a positive voltage is applied to the anode electrode; and a flying direction of the sputtering particles is curved to the direction of central axis of the anode electrode by the anode electrode, then curved in the opposite direction by the earth electrode.

11. The sputtering apparatus according to claim 10, wherein the substrate table is mounted on a wafer stage, and a negative voltage can be applied to the wafer stage.

12. A film manufacturing method wherein a target is positioned in a vacuum chamber, the vacuum chamber is connected to earth potential, a negative voltage is applied to the target so t at a plasma is formed in the vicinity of the surface of the target, and sputtering particles flying off from the target reach a substrate positioned with a surface facing the target so as to form a film n the surface of the substrate, the film forming method, comprising the steps of:

surrounding with anode electrode, the periphery of a portion on the target side, of flying space where sputtering particles flying off from the target are flying, of space between the target and the substrate table, the anode electrode having, at an outer periphery of one end thereof, a flange;

surrounding a periphery of the substrate with an earth electrode which extends towards the axis of the anode electrode at an angle relative to the anode electrode;

a length between upper end and a lower end of the anode electrode being longer than a length between an upper end and a lower end of the earth electrode;

connecting the earth electrode to earth potential to apply a positive voltage to the anode electrode through a conductive terminal which is electrically insulated from the vacuum chamber, the conductive terminal projection towards an inside portion of the vacuum chamber and the flange of the anode electrode being mounted on the conductive terminal; and sputtering the target.

13. A film manufacturing method wherein a target is positioned in a vacuum chamber, the vacuum chamber is connected to earth potential, a negative voltage is applied to the target so t at a plasma is formed in the vicinity of the surface of the target, and sputtering particles flying off from the target reach a substrate positioned with a surface facing the target so as to form a film on the surface of the substrate, the film forming method, comprising the steps of:

surrounding with anode electrode, the periphery of a portion on the target side, of flying space where sputtering particles flying off from the target are flying, of space between the target and the substrate table, the anode electrode having, at an outer periphery of one end thereof, a flange;

surrounding a periphery of the substrate with an earth electrode which extends towards the axis of the anode electrode at an angle relative to the anode electrode;

connecting the earth electrode to earth potential to apply a positive voltage to the anode electrode through a conductive terminal which is electrically insulated from the vacuum chamber, the conductive terminal projecting towards an inside portion of the vacuum chamber, and the flange of the anode electrode being mounted on the conductive terminal;

introducing sputtering as when the plasma is then stopping introduction of sputtering gas after the plasma was formed, maintaining a plasma by self-discharge; and sputtering the target.

* * * * *

UNITED STATES PATENT AND TRADEMARK OFFICE
CERTIFICATE OF CORRECTION

PATENT NO. : 6,706,155 B2
DATED : March 16, 2004
INVENTOR(S) : Morimoto, Naoki et al.

It is certified that error appears in the above-identified patent and that said Letters Patent is hereby corrected as shown below:

<u>Title page,</u>
Insert Item -- [73] Assignee:   ULVAC, Inc., Chigasaki, (JP) --

<u>Column 12,</u>
Line 35, change "so t at" to be -- so that --
Line 56, change "sputtering as" to be -- sputtering gas --

Signed and Sealed this

Seventeenth Day of May, 2005

JON W. DUDAS
*Director of the United States Patent and Trademark Office*